United States Patent
Maxwell

(10) Patent No.: US 9,312,483 B2
(45) Date of Patent: Apr. 12, 2016

(54) ELECTRODE STRUCTURE FOR A NON-VOLATILE MEMORY DEVICE AND METHOD

(71) Applicant: Crossbar, Inc., Santa Clara, CA (US)

(72) Inventor: Steven Patrick Maxwell, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 13/625,817

(22) Filed: Sep. 24, 2012

(65) Prior Publication Data

US 2014/0084233 A1    Mar. 27, 2014

(51) Int. Cl.
*H01L 29/02* (2006.01)
*H01L 45/00* (2006.01)

(52) U.S. Cl.
CPC .............. *H01L 45/148* (2013.01); *H01L 45/04* (2013.01); *H01L 45/1233* (2013.01); *H01L 45/1616* (2013.01); *H01L 45/1675* (2013.01)

(58) Field of Classification Search
CPC ........................... H01L 45/04; H01L 45/1233
USPC ..................................................... 257/1–5
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Notice of Allowance for U.S. Appl. No. 12/814,410 dated Jan. 8, 2013.

(Continued)

*Primary Examiner* — Cheung Lee
*Assistant Examiner* — Frederick B Hargrove
(74) *Attorney, Agent, or Firm* — Amin, Turocy & Watson, LLP

(57) ABSTRACT

A method of forming a resistive switching device includes forming a wiring structure over a first dielectric and substrate, forming a junction layer over the wiring structure, forming a resistive switching layer over the junction layer, forming an active metal over the resistive switching layer, forming a tungsten layer over the active metal, forming a barrier layer over the tungsten, depositing a mask over the barrier layer, etching the barrier layer to form a hard mask, etching the junction layer, the resistive switching layer, the active metal layer, and the adhesion layer using the hard mask to form a stack of material, while the adhesion layer maintains adhesion between the barrier layer and the active metal and while side walls of the stack of material have reduced contaminants and have reduced gap regions between the barrier layer and the resistive switching layer.

13 Claims, 7 Drawing Sheets

(56) References Cited

U.S. PATENT DOCUMENTS

| | | |
|---|---|---|
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,707,487 A | 1/1998 | Hori et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,973,335 A | 10/1999 | Shannon |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,858,468 B2 | 12/2010 | Liu et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Nazarian et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0071034 A1 | 4/2004 | Vyvoda et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0250836 A1 | 11/2006 | Herner et al. |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |

(56) References Cited

U.S. PATENT DOCUMENTS

| | | |
|---|---|---|
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0251940 A1 | 10/2009 | Ito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1* | 12/2011 | Herner .......................... 438/384 |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1* | 1/2012 | Jo et al. .......................... 438/482 |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |
| 2013/0026440 A1 | 1/2013 | Yang et al. |
| 2014/0070160 A1 | 3/2014 | Ishikawa et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |
| WO | WO 2011/133138 A1 | 10/2011 |

OTHER PUBLICATIONS

Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.

(56) References Cited

OTHER PUBLICATIONS

Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Office Action of U.S. Appl. No. 13/436,714 dated Dec. 7, 2012.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60,1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, The University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.

(56) References Cited

OTHER PUBLICATIONS

Sung Hyun Jo et al., "Nanoscale Memristor Device as Synapse in Neuromorphic Systems", Nano Letters, 10, 1297-1301, 2010, pubs. acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/$p^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: Volume 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.

(56) References Cited

OTHER PUBLICATIONS

Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/705,082, dated Sep. 2, 2014.
Office Action for U.S. Appl. No. 13/739,283, dated Sep. 11, 2014.
Office Action for U.S. Appl. No. 13/756,498, dated Sep. 12, 2014.
Notice of Allowance for U.S. Appl. No. 13/462,653 dated Sep. 17, 2014.
Notice of Allowance for U.S. Appl. No. 13/586,815, dated Sep. 18, 2014.
Notice of Allowance for U.S. Appl. No. 13/920,021, dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,941, dated Oct. 8, 2014.
Notice of Allowance for U.S. Appl. No. 13/077,941, dated Aug. 27, 2014.
Office Action for U.S. Appl. No. 13/625,817 dated Feb. 28, 2014, 11 pages.
Office Action for U.S. Appl. No. 12/913,719 dated Feb. 17, 2011, 11 pages.
Office Action for U.S. Appl. No. 12/913,719 dated Jul. 22, 2011, 12 pages.
Notice of Allowance for U.S. Appl. No. 12/913,719 dated Mar. 12, 2012, 5 pages.
Notice of Allowance for U.S. Appl. No. 13/532,019 dated Nov. 14, 2012, 8 pages.
Office Action for U.S. Appl. No. 13/564,639 dated Mar. 19, 2013, 14 pages.
Suehle et al., "Temperature Dependence of Soft Breakdown and Wear-Out in Sub-3 nm SiO2 Films", 38th Annual International Reliability Physics Symposium, 2000, pp. 33-39, IEEE, San Jose, California, 7 pages.
Shin et al., "Effect of Native Oxide on Polycrystalline Silicon CMP", Journal of the Korean Physical Society, Mar. 2009, pp. 1077-1081, vol. 54, No. 3, 5 pages.
Office Action for U.S. Appl. No. 13/447,036 dated Jul. 9, 2013, 16 pages.
Office Action for U.S. Appl. No. 13/764,698 dated Jul. 11, 2013, 8 pages.
Office Action for U.S. Appl. No. 13/481,600 dated Sep. 20, 2013, 16 pages.
Office Action for U.S. Appl. No. 14/072,657 dated Jun. 17, 2014, 6 pages.
Office Action for U.S. Appl. No. 14/310,111 dated Jul. 7, 2015, 11 pages.
Jamaa et al., "Fabrication of Memristors with Poly-Crystalline Silicon Nanowires", 9th IEEE Conference on Nanotechnology, 2009, pp. 152-154, IEEE, 3 pages.
Office Action for U.S. Appl. No. 13/564,639 dated Dec. 6, 2013, 15 pages.

\* cited by examiner

ELECTRODE STRUCTURE FOR A NON-VOLATILE MEMORY DEVICE AND METHOD

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability In a specific embodiment, a method of forming a non-volatile memory device is provided. The method includes providing a substrate having a surface region. A first dielectric material is formed overlying the surface region of the substrate and a first wiring structure is formed overlying the first dielectric material. The method includes forming a junction layer material overlying the first wiring structure and a resistive switching material is deposited overlying the junction layer material. In a specific embodiment, the resistive switching material comprises an amorphous silicon material. The method forms an active conductive material overlying the resistive switching material. For amorphous silicon material as the resistive switching material, the active conductive material can be silver in a specific embodiment. An adhesion material comprising a tungsten material is formed overlying the active conductive material and a diffusion barrier material is formed overlying the adhesion material. In a specific embodiment, the method includes depositing a masking material comprising a photoresist material overlying the diffusion barrier material and subjecting the diffusion barrier material to a first etching process to form a hard mask layer comprising the diffusion barrier material. The method subjects a stack of material comprising the junction material, the resistive switching material, the active conductive material, and the adhesion material to a second etching process to form a first structure using at least the masking layer and the hard mask layer as an etching mask. The first structure has reduced undercut between the adhesion material and the active conductive material and with reduced contaminants from the first etching process or the second etching process. A second wiring structure is formed overlying the stack of material including the diffusion barrier material.

In a specific embodiment, a method of forming a non-volatile memory device is provided. The method includes providing a substrate having a surface region. A first dielectric material is formed overlying the surface region of the substrate. A first wiring structure is formed overlying the first dielectric material. In a specific embodiment, a junction layer material comprising a silicon material having a p+ impurity characteristic is formed overlying the first wiring structure. The method forms a resistive switching material overlying the junction layer material. The resistive switching material includes a silicon material having an intrinsic semiconductor characteristic. In a specific embodiment, the silicon material having an intrinsic semiconductor characteristic includes an amorphous silicon material having an intrinsic semiconductor characteristic. The method includes forming an active conductive material overlying the resistive switching material. The active conductive material can be a silver metal material for amorphous silicon as the resistive switching material. In a specific embodiment, the method forms an adhesion material comprising a tungsten material overlying the active conductive material and forms a diffusion barrier material comprising a titanium nitride material overlying the adhesion material. A masking material overlying the diffusion barrier material and the diffusion barrier material is subjected to a first etching process to form a hard mask layer. The hard mask layer includes the diffusion barrier material in a specific embodiment. In a specific embodiment, the method subjects a stack of material comprising the junction material, the resistive switching material, the active conductive material, and the adhesion material to a second etching process to form a first structure. The second etching process uses at least the masking layer and the hard mask layer as an etching mask and the first structure is characterized at least by a side wall free from an undercut between the adhesion material and the active conductive material. The method further forms a second wiring structure overlying the stack of material including the diffusion barrier material According to one aspect of the present invention, a method of forming a resistive switching device for a non-volatile memory device is disclosed. One technique includes providing a substrate having a surface region, forming a first dielectric layer overlying the surface region of the substrate, forming a first wiring structure overlying the first dielectric layer, and forming a junction layer overlying the first wiring structure. A process includes forming a resistive switching layer overlying the junction layer, forming an active metal layer overlying the resistive switching layer, forming an adhesion layer comprising a tungsten material overlying the active metal layer, and forming a diffusion barrier layer overlying the adhesion layer. A method includes depositing a masking layer overlying the diffusion barrier layer, subjecting the diffusion barrier layer to a first etching process to form a hard mask layer comprising the diffusion barrier layer, subjecting a stack of material comprising the junction layer, the resistive switching layer, the active metal layer, and the adhesion layer to a second etching process to form a first structure using at least the masking layer and the hard mask layer as an etching mask while the adhesion layer maintaining adhesion between the diffusion barrier layer and the active metal layer, the first structure being characterized by a side wall with reduced contaminants from the first etching process or the second etching process and with a reduced gap region between the diffusion barrier layer and the resistive switching layer, and forming a second wiring structure overlying the stack of material including the diffusion barrier layer.

According to another aspect of the invention, a resistive switching device for a non-volatile memory device is disclosed. One device includes a substrate having a surface region, a first dielectric layer overlying the surface region of the substrate, and a first wiring structure overlying the first dielectric layer. A memory includes a junction layer overlying the first wiring structure, a resistive switching layer overlying the junction layer, an active metal layer overlying the resistive switching layer, an adhesion layer comprising a tungsten material overlying the active metal layer, and a diffusion barrier layer overlying the adhesion layer. A device includes a stack of material comprising the junction layer, the resistive switching layer, the active metal layer, and the adhesion layer, wherein the first structure being characterized by a side wall with reduced contaminants from the first etching process or the second etching process and with a reduced gap region between the diffusion barrier layer and the resistive switching layer, and a second wiring structure overlying the stack of material including the diffusion barrier layer.

Many benefits can be achieved by ways of the present invention over conventional techniques. For example, the present method uses conventional semiconductor material and processing equipment without modification. Embodiments according to the present invention provide a method and a device structure for fabricating a resistive switching device structure free from defects or material incompatibility. Depending on the embodiment, one or more of the benefits may be achieved. One skilled in the art would recognize other variations, modifications, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are direct to resistive switching devices. More particularly, embodiments according to the present invention provide a method and a device structure for fabricating a resistive switching device. The resistive switching device has been used in a non-volatile memory device, but it should be recognized that embodiments according to the present invention can have a much broader range of applicability.

Resistive switching device exploits a unique property of electrical resistance change upon application of an electric field of certain non-conductive materials. A resistive switching device using a silicon material as the resistive switching material has an advantage of complete compatibility with current CMOS processing techniques. To change the resistance of the resistive switching material, a conductive material is provided in direct contact with the resistive switching material. The conductive material is characterized by a suitable diffusivity in the resistive switching material upon application of an appropriate electric field. Diffusion due to thermal effect or mass transfer should be insignificant compared to diffusion due to the electrical effect. The electric filed can be provided by applying a voltage or a current to the resistive switching device. For resistive switching device using silicon material as the resistive switching material, metal material such as silver, gold, palladium, platinum, aluminum, and others may be used. Silver material has the desirable diffusivity characteristic in amorphous silicon resistive switching material in presence of an electric field. Due to high mobility and surface characteristic of silver, deposition of silver onto a semiconductor surface and to fill a small area of opening can be challenging. Additionally, resistive ion etching of silver may not be possible due to lack of volatile species derived from silver. Accordingly, embodiments of the present invention provide a method and a device structure for a resistive switching device using amorphous silicon material as the resistive switching material and a silver material as an active conductive material.

Figure 1:
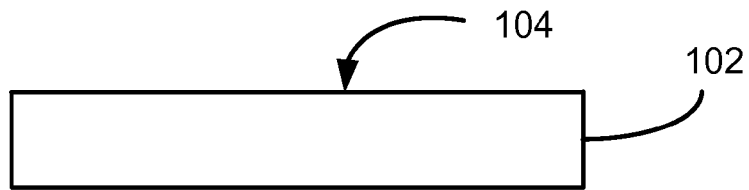
FIG. 1 is a simplified diagram illustrating a fabrication step according to various embodiments of the present invention.

As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 102 can have one or more MOS devices formed thereon or therein. The one or more MOS devices can be controlling circuitry for the resistive switching device, or the like in some embodiments.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 2:
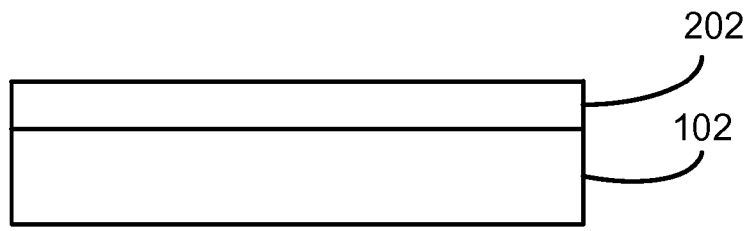
FIG. 2 is a simplified diagram illustrating a fabrication step according to various embodiments of the present invention.

As illustrated in FIG. 2, embodiments of the method include depositing a first dielectric material 202 overlying the semiconductor substrate 102. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 3:
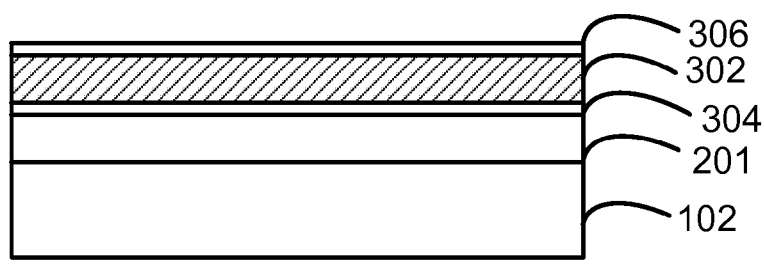
FIG. 3 is a simplified diagram illustrating a fabrication step according to various embodiments of the present invention.

Referring to FIG. 3, embodiments of the method include depositing a first wiring material 302 overlying the first dielectric material. First wiring material 302 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 304 is first formed overlying the first dielectric material 302 before deposition of the first wiring material 302 to promote adhesion of the first wiring material 302 to the first dielectric material 202. A diffusion barrier material 306 may also be formed overlying the first wiring material 302 to prevent, for example, the conductive material, the metal material, gasses, oxygen, or the like to contaminate other portions of the device in a specific embodiment.

Figure 4:
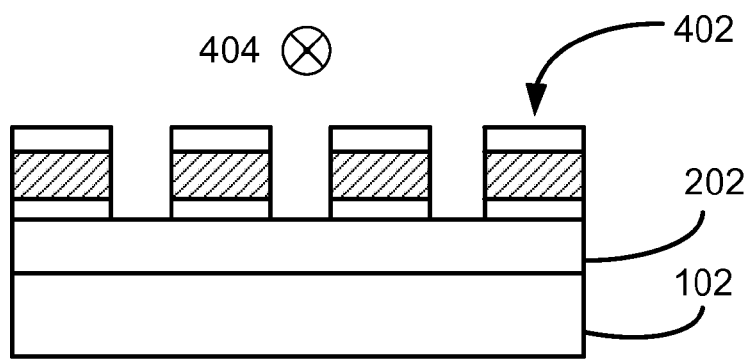
FIG. 4 is a simplified diagram illustrating a fabrication step according to various embodiments of the present invention.
Figure 5:
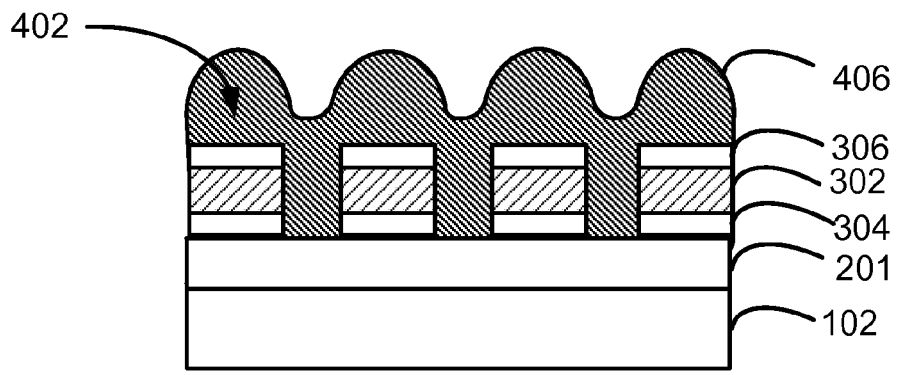
FIG. 5 is a simplified diagram illustrating a fabrication step according to various embodiments of the present invention.

In FIG. 4, an embodiment of the method subjects the first wiring material (302, 304 and 306) to a first pattern and etching process to form a first wiring structure 402 in a specific embodiment. As shown in FIG. 4, the first wiring structure 402 includes a plurality of first elongated structures configured to extend in a first direction 404 (into and out of the page) in a specific embodiment. In a specific embodiment, the method deposits a second dielectric material 406 overlying the first wiring structure, as illustrated in FIG. 5. The second dielectric material 406 can be silicon oxide, silicon nitride, a dielectric stack of alternating layers of silicon oxide and silicon nitride (for example, an ONO stack), a low K dielectric, a high K dielectric, or a combination, and others, depending on the application.

Figure 6:
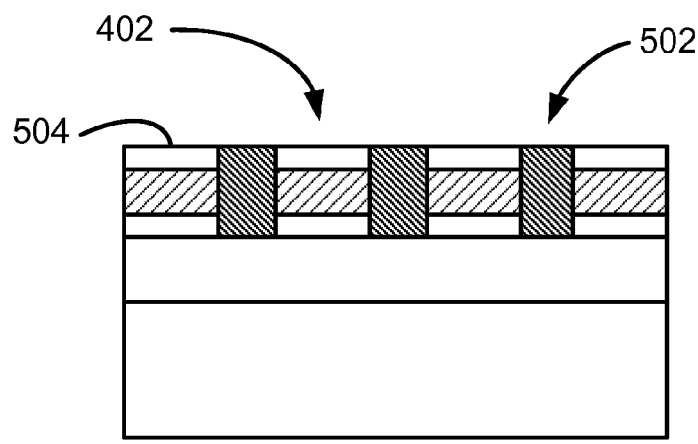
FIG. 6 is a simplified diagram illustrating a fabrication step according to various embodiments of the present invention.

As illustrated in FIG. 6, second dielectric material 406 can be subjected to a planarizing process to isolate the first wiring structures 402 in a specific embodiment. The planarizing process can be a chemical mechanical polishing process or an etch back process, a combination thereof, and others depending on the application. As shown in FIG. 6, a surface region 504 of the diffusion barrier material is exposed, and second dielectric material 406 remains in the spaces 502 between first wiring structure 402.

Figure 7:
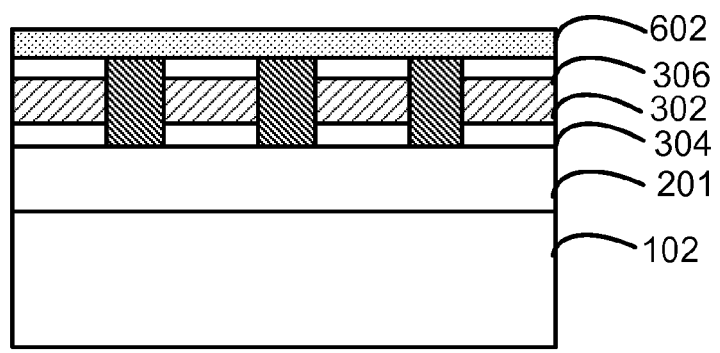
FIG. 7 is a simplified diagram illustrating a fabrication step according to various embodiments of the present invention.

Referring to FIG. 7, embodiments of the present invention includes a step of depositing a junction material 602 overlying the first wiring structure 402 and exposed surface region 504 of the second dielectric material 306. In various embodiments, junction material 602 can be a conductive p-doped silicon containing material, polycrystalline silicon material having a p+ impurity characteristic or a polycrystalline silicon germanium material having a p+ impurity characteristic, or a combination thereof. Junction material 602 can be deposited using techniques such as a chemical vapor deposition process including low pressure chemical vapor deposition process, plasma-enhanced chemical vapor deposition process, using silicon precursor such as silane ($SiH_4$), disilane ($Si_2H_6$), or a chlorosilane in a suitable reducing environment depending on the embodiment. Deposition temperature ranges from about 380 Degree Celsius to about 450 Degree Celsius and not greater than about 440 Degree Celsius depending on the application. Alternatively, junction material 602 can be deposited using a physical vapor deposition process from a suitable silicon target. In a specific embodiment, junction material 602 can be deposited using a low pressure chemical vapor deposition process using disilane at a deposition temperature ranging from about 400 Degree Celsius to about 460 Degree Celsius. In some embodiments, junction material 602 is configured to have the polycrystalline characteristic as deposited free from an anneal process.

Figure 8:
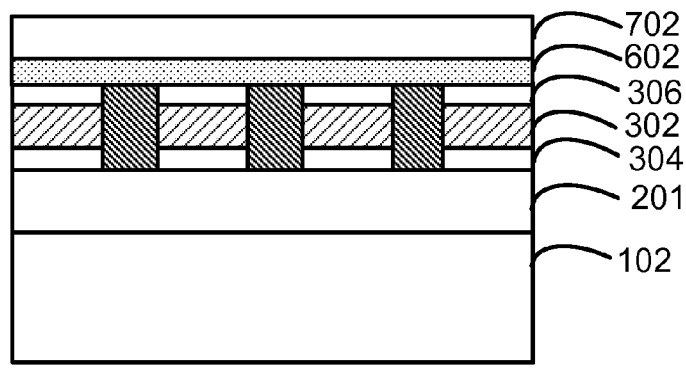
FIG. 8 is a simplified diagram illustrating a fabrication step according to various embodiments of the present invention.

Referring to FIG. 8, in some embodiments, the method deposits a resistive switching material 702 overlying junction material 602 (for example, the polycrystalline silicon having the p+ impurity characteristic). The resistive switching material 702 can include a suitable insulator material having a resistance that can be altered upon application of an electric field to the insulator material. In a specific embodiment, the resistive switching material 702 can include a silicon material. For example, the silicon material can be an amorphous silicon material, a microcrystalline silicon material, a macro crystalline silicon material, a silicon germanium material, a silicon oxide, and including any combination of these. In some embodiments, the silicon material includes an amorphous silicon material.

The resistive switching material 702 is characterized by a state, for example, a resistance state dependent on an electric field in the switching material. In a specific embodiment, the switching material 702 is an amorphous silicon material and/or a silicon oxide. The amorphous silicon material and/or silicon oxide has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4) (45 sccm) and Helium (He) (500 sccm) is used to form an a-Si layer with a deposition rate of 80 nm per minute (T=260° C., P=600 mTorr) during PECVD. In another exemplary process, a mixture of silane (SiH4) (190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material and/or silicon oxide is substantially free of any p-type, n-type or metallic dopants, i.e. the amorphous silicon material is undoped.

In another embodiment, the resistive switching material/amorphous silicon material 702 may be formed from an upper region of a p+ polycrystalline silicon or p+ silicon germanium bearing layer (e.g. 602) using an Argon, Silicon, Oxygen plasma etch, or the like. For instance, a plasma etch may use a bias power within a range of approximately 30 watts to approximately 120 watts to convert an upper region of the polysilicon or silicon germanium material 602 into a non-conductive amorphous silicon 702 and/or a silicon oxide layer (in some embodiments having p-type impurities from the original polycrystalline silicon or silicon geranium bearing layer 602). In some embodiments, resistive switching material 702 may be on the order of about 2 nm to about 5 nm.

Figure 9:
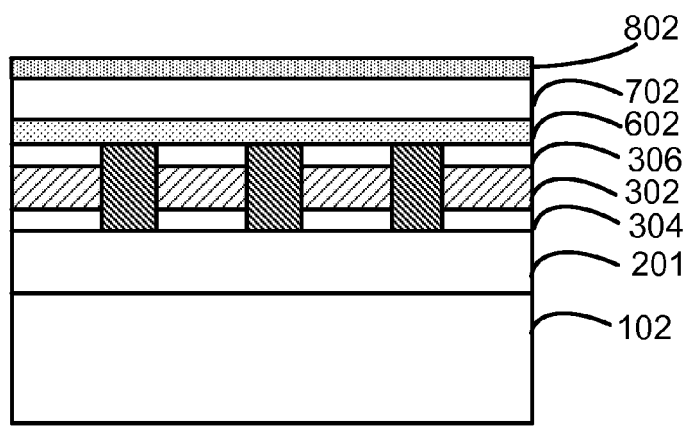
FIG. 9 is a simplified diagram illustrating a fabrication step according to various embodiments of the present invention.

In the embodiment illustrated in FIG. 9, the method includes forming an active metal material layer 802 overlying the resistive switching material 702. The active metal material is characterized by a suitable diffusivity in the resistive switching material 702 under an influence of an electric field. The electric filed may be provided by applying a voltage or a current depending on the application. Taking a silicon-bearing material (for example, an amorphous silicon material and/or silicon oxide material) as the resistive switching material 702, the active metal material 802 can be silver, gold, palladium, platinum, aluminum, chromium, or an alloy material derived from one or more of these metal materials, and others.

In some specific embodiments, the active metal material 802 is a silver material deposited using a physical vapor deposition process (for example, sputtering, or evaporation), a chemical vapor deposition process, an electrochemical deposition process (for example, a electroplating), an electroless deposition process, or a combination, and others. In certain embodiments, the amorphous silicon material may have a silicon oxide material formed overlying the surface region.

In various embodiments, an interposing additional layer(s) may be disposed between resistive switching material 602 and active metal material 802. The additional layer may include a material that has non-noble metal properties, e.g. the material oxidizes in the presence of oxygen. In some examples, the additional layer may be titanium, titanium nitride, tungsten, tungsten nitride, or the like. In various embodiments, the additional layer may serve as an adhesion and/or barrier layer between resistive switching material 602 and active metal material 802. In various embodiments, additional layer(s) may be thin, e.g. 3 to 5 nm and may enhance retention.

Figure 10:
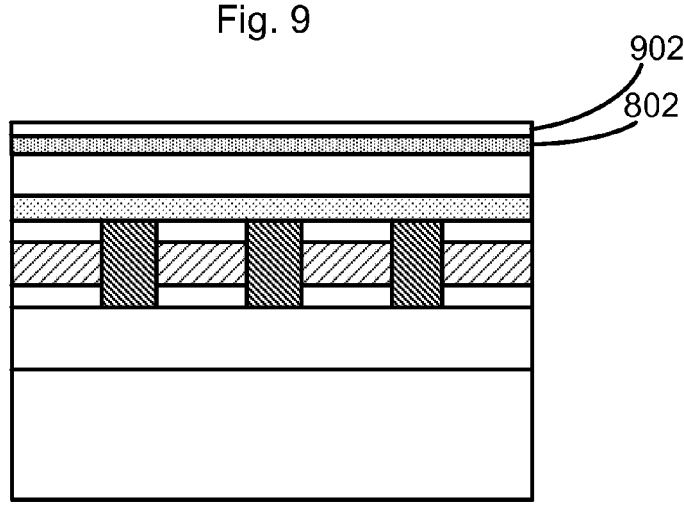
FIG. 10 is a simplified diagram illustrating a fabrication step according to various embodiments of the present invention.

In the embodiments shown in FIG. 10, an adhesion material 902 is deposited overlying active metal material 802. Adhesion material 902 can be titanium, titanium nitride, tungsten, titanium tungsten, or a combination, and others. In a specific embodiment, adhesion material 902 is a tungsten material deposited using a physical vapor process such as a sputtering process from a suitable tungsten target material. Other suitable deposition process for adhesion material 902 may also be used. These deposition processes can include chemical vapor deposition electrochemical deposition (for example, electroplating), electroless deposition, or a combination, and others.

In some embodiments, the physical vapor deposition process is performed at room temperature free from application of an external heat. The deposited tungsten material is characterized by a thickness ranging from about 30 Angstroms to about 120 Angstrom. In other embodiments, the deposited tungsten material can have a thickness ranging from about 40 Angstrom to about 70 Angstrom. In some examples, tungsten material has certain advantages over other adhesion material, for example, resistance to acids and bases or solvents used in post etch cleaning. Additionally, tungsten alloys easily with a silver material to provide good electrical contact.

In various embodiments, the adhesion material 902 is formed a short period of time after active conductive material 802 is formed. As examples, the short period of time may be less than 10 minutes, 20 minutes, 1 hour, or the like. In some examples, the short period of time is defined as less than or equal to about 4 hours, 6 hours, 8 hours, or the like. By specifying a short period of time, atmospheric oxygen is inhibited from being absorbed into active conductive material 802 and/or transported to resistive switching material 702, or interface between active conductive material 802 and resistive switching material 702, or the like.

In other embodiments, to reduce the amount of oxygen absorbed or contained within resistive switching material 702 or in active conductive material 802, the partially completed device is placed in an oxygen-reduced environment (e.g. substantially oxygen-free) a short time after active conductive material 802 is deposited. In some embodiments, the short period of time may be less than 15 minutes, 30 minutes, 2 hours, 4 hours, or the like. In some examples, the short period of time is defined as less than or equal to about 8 hours. In various embodiments, the partially completed device is kept in the oxygen-reduced environment until the adhesion material 902 is deposited. In other embodiments, adhesion material 902 is formed in situ, after active conductive material 802 is formed.

Figure 11:
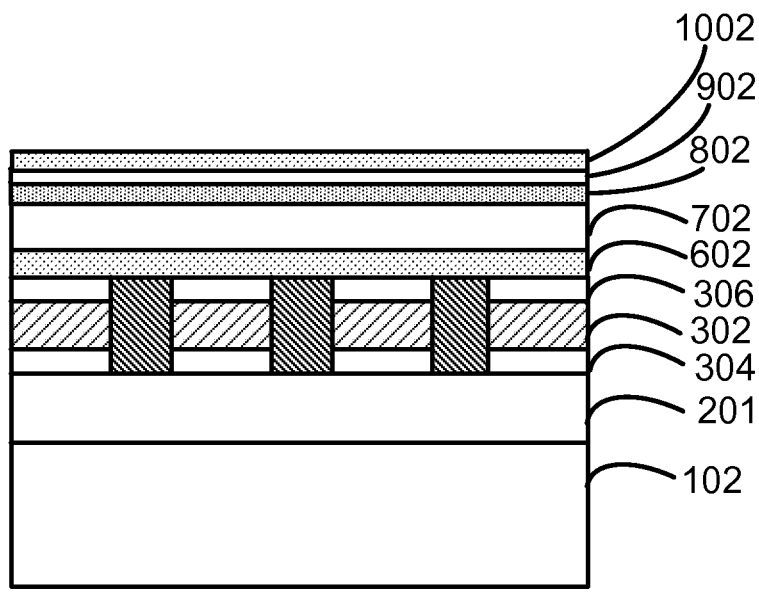
FIG. 11 is a simplified diagram illustrating a fabrication step according to various embodiments of the present invention.

In the embodiment illustrated in FIG. 11, the method deposits a diffusion barrier material 1002 overlying adhesion material 902. Diffusion barrier material 1002 can be titanium, titanium nitride, titanium tungsten, or a combination (e.g Ti/TiN), and others depending on the application.

Figure 12:
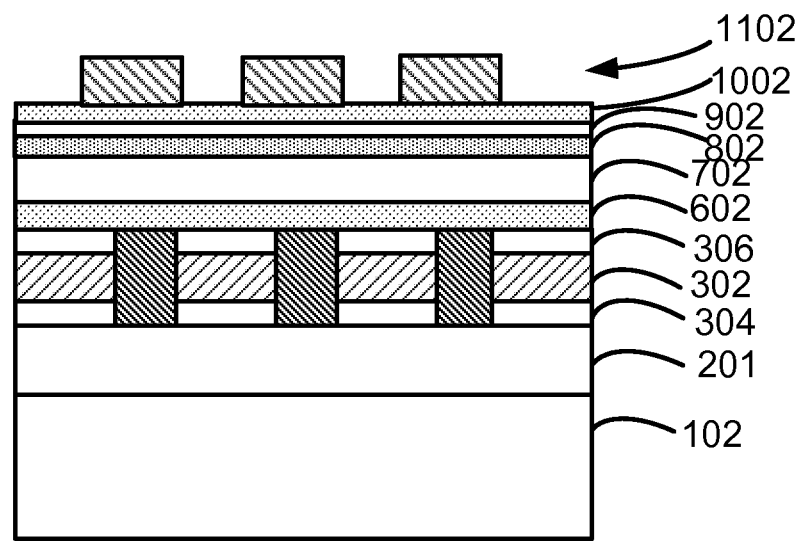
FIG. 12 is a simplified diagram illustrating a fabrication step according to various embodiments of the present invention.

Next, in a specific embodiment, the method includes foiling a masking material 1102 overlying diffusion material 1002 and patterning it, as shown in FIG. 12. Masking material is a suitable photoresist material in a specific embodiment.

Figure 13:
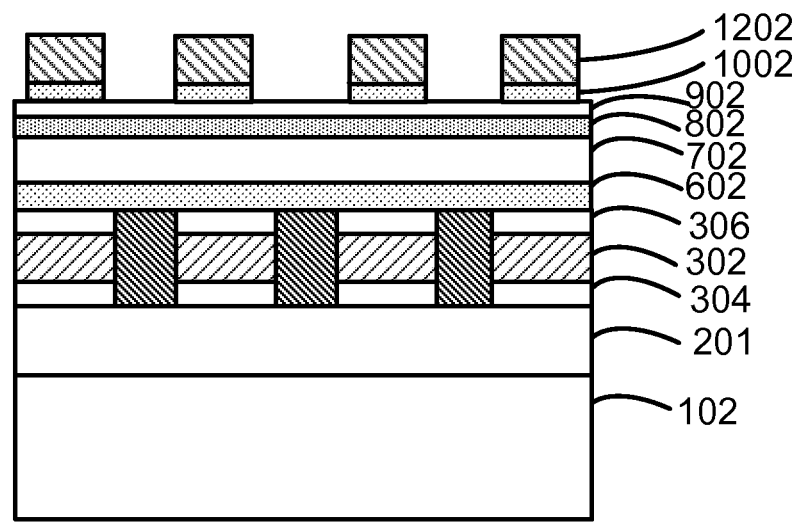
FIG. 13 is a simplified diagram illustrating a fabrication step according to various embodiments of the present invention.

Next, in various embodiments, as shown in FIG. 13, patterned masking material 1102 is used to etch diffusion barrier material 1002 to form a hard mask 1202. In various embodiments, the pattern may be an array of squares, circles, polygons, or substantially similar thereto, e.g. trapezoidal, ovals, polygonal with rounded edges, or the like.

Figure 14:
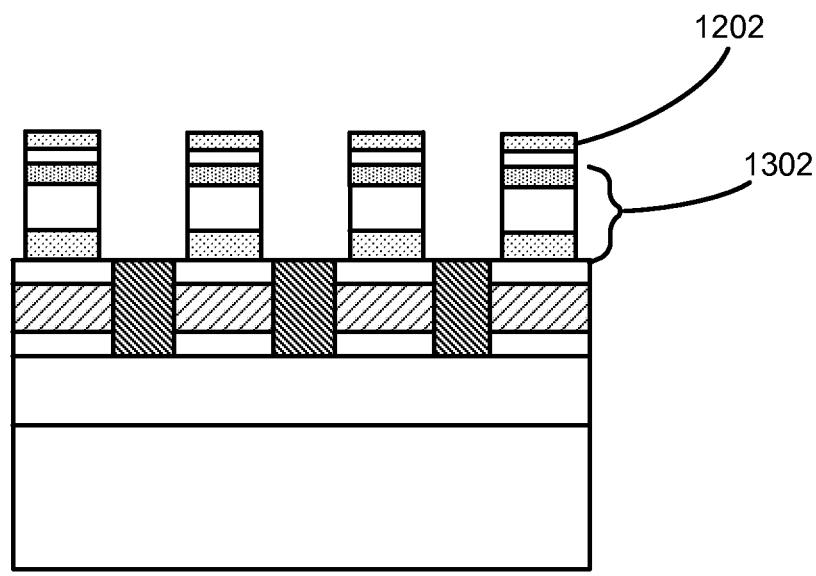
FIG. 14 is a simplified diagram illustrating a fabrication step according to various embodiments of the present invention.

In various embodiments of the invention, the method then subjects a stack of material comprising at least adhesion material 902, active metal material 802, resistive switching material 702, and junction material 602 to an etching using at least photoresist masking layer 1102, and hard mask 1202 as a mask. Depending on the application, the etching process can be an ion milling process using an inert gas such as argon in a specific embodiment. The etching process forms a first structure 1302 as shown in FIG. 14.

In the present example, first structure 1302 comprises adhesion material 902, active metal material 802, resistive switching material 702, and junction material 602, as shown. First structure 1302 is characterized by a resistive material side wall and a junction material side wall with reduced contaminants that may cause undesirable electrical connections between parts of the resistive switching device. Further, adhesion material 902 maintains physical contact with active conductive material 802 and diffusion barrier material 1002 thus with reduced undercut region or a gap region or a void region between diffusion barrier material 1002 and active metal material 802. In various embodiments, first structure 1302 may be an array of pillars having a cross-sectional shape, as discussed above, or the like.

Figure 15:
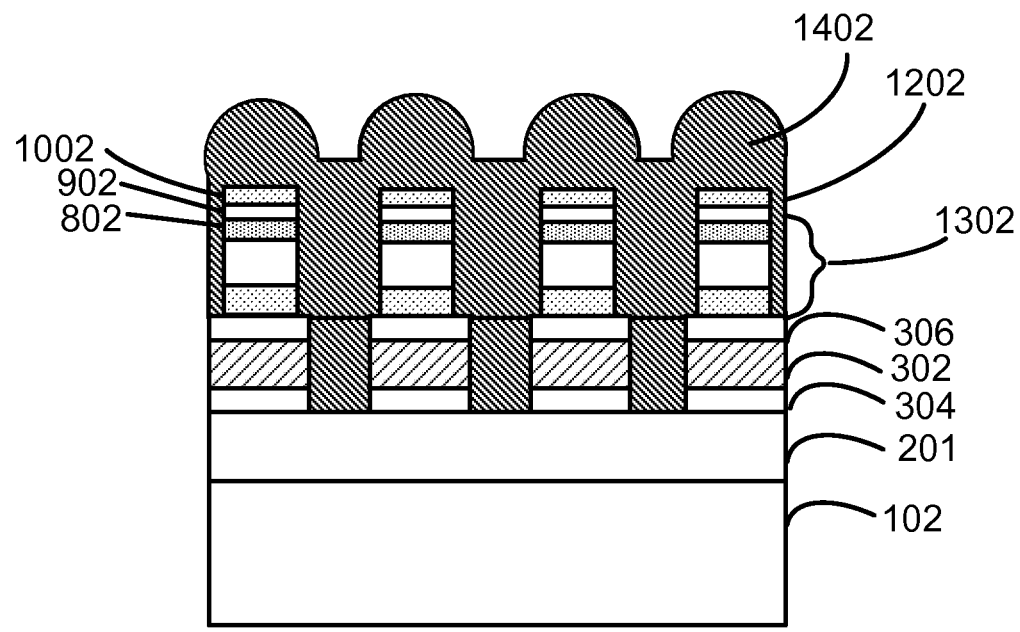
FIG. 15 is a simplified diagram illustrating a fabrication step according to various embodiments of the present invention.

In the embodiments illustrated in FIG. 15, the method includes forming a third dielectric material 1402 overlying the first structure 1302 and filling the gaps between each of the first structures 1302. Third dielectric material 1402 can be silicon oxide, silicon nitride, a dielectric stack of alternating layers of silicon oxide and silicon nitride (for example, an ONO stack), a low K dielectric, a high K dielectric, or a combination, and others, depending on the application. In some embodiments, a thin layer of non-conductive titanium/titanium oxide, or the like is deposited prior to forming the third dielectric material 1402.

Figure 16:
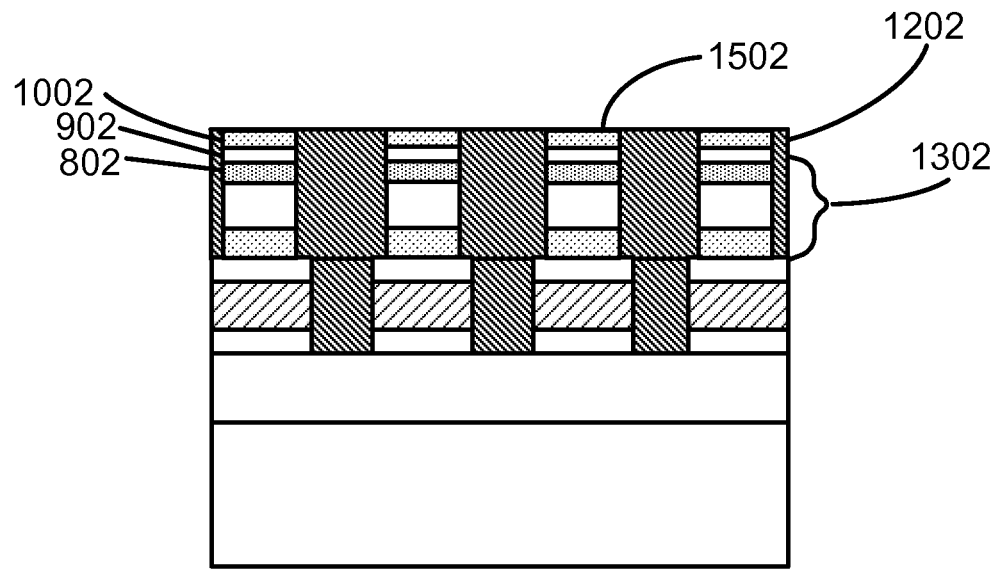
FIG. 16 is a simplified diagram illustrating a fabrication step according to various embodiments of the present invention.

As shown in FIG. 16, the method subjects third dielectric material 1402 to a planarizing process. The planarizing process can be a chemical mechanical polishing process or an etch back process or a combination, depending on the application. The planarizing process exposes a top surface region 1502 of the first structure 1302 comprising a top surface region of the diffusion barrier material 1002 and isolate the first structure, as shown.

Figure 17:
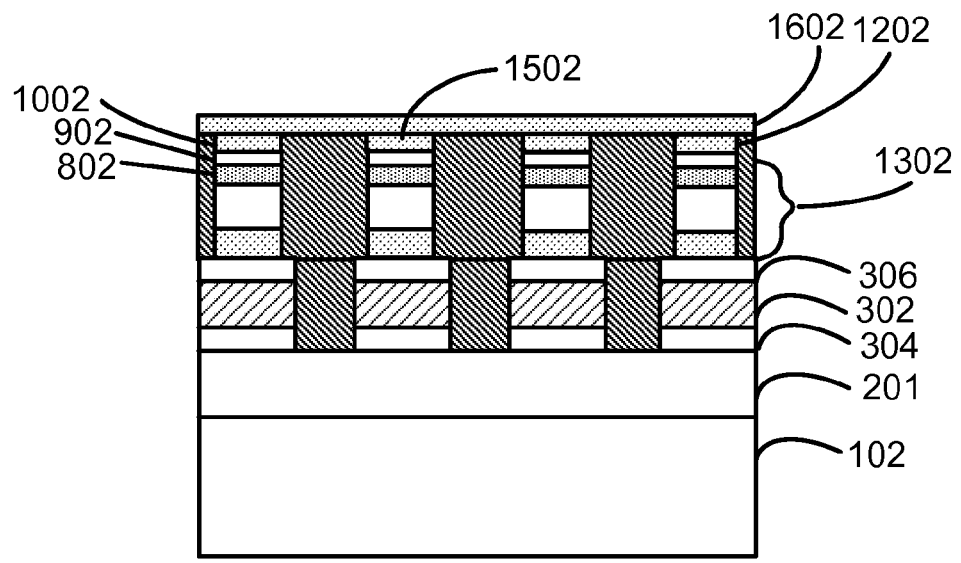
FIG. 17 is a simplified diagram illustrating a fabrication step according to various embodiments of the present invention.

Next, in various embodiments, as illustrated in FIG. 17, the method forms an adhesion material 1602 overlying the exposed surface region 1502 of diffusion barrier material 1202 and an exposed surface region of the fourth dielectric material. In some embodiments, adhesion material 1602 can be titanium, titanium nitride, titanium tungsten, and others. In a specific embodiment, adhesion material can be titanium nitride, deposited using techniques such as chemical vapor deposition process, physical vapor deposition process, atomic layer deposition (ALD), a combination, and others.

Figure 18:
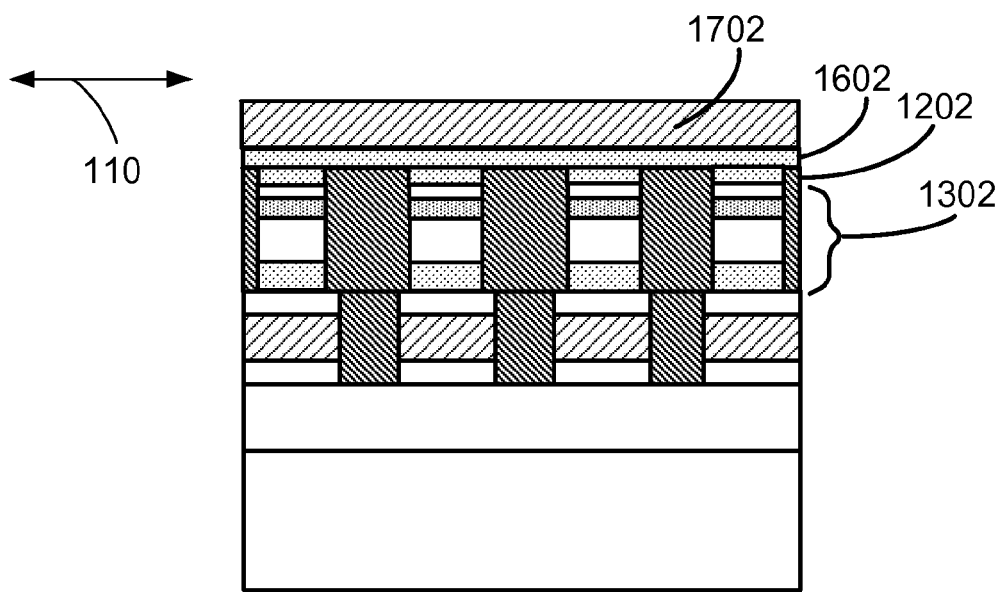
FIG. 18 is a simplified diagram illustrating a fabrication step according to various embodiments of the present invention.

As shown in FIG. 18, in various embodiments, the method includes forming a second wiring material 1702 overlying adhesion material 1602. The second wiring material can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments.

In various embodiments, second wiring material 1702 together with adhesion material 1602 are subjected to a patterning and etching process to form one or more second wiring structures. The one or more second wiring structures are configured to spatially extend in a second direction 110 at an angle to the first direction 220 of the first wiring structure 402. In a specific embodiment, the first wiring structure and the second wiring structure are configured to be orthogonal to each other and at least the resistive switching material 802 is sandwiched in an intersection region of the first wiring structure 402 and the second wiring structure 1702. The method can further include forming passivation layers and global interconnects for the memory device, among others to complete the device.

In a specific embodiment, the active conductive material 902 forms a conductive material region in a portion of the resistive witching material 802 when a first voltage greater than about a threshold voltage is applied to the first wiring structure or the second wiring structure. The conductive material region causes a change in resistance of the resistive switching material. As merely an example, for amorphous silicon as the switching material and silver as the active conductive material, a positive bias greater than a threshold voltage applied to the second wiring structure causes a silver region to form in a portion of the amorphous silicon material and causes a change in resistance of the amorphous silicon material. The switching device is now in a low resistance state or an off state. In a specific embodiment, the silver region further includes a filament structure that extends or retracts depending on an operating voltage. That is, when a positive bias greater than a first voltage is applied to the second wiring structure of an off state device, the filament extends and the device in is at an on state. A negative bias applied to the second wiring structure of an on state device causes the device to be at the off state again. Of course one skilled in the art would recognize other modifications, variations, and alternatives.

Depending on the application, there can be other variations. For example, the active conductive material (for example, the silver material) may be provided in a via structure to control a contact area of the active conductive material with the resistive switching material in certain embodiments. The size of the via structure can control the filament structure and device performance in certain embodiments.

In a specific embodiment, a resistive switching device structure for a non-volatile memory device is provided. The resistive switching device includes a substrate having a surface region. The substrate can be a single crystal silicon wafer, a silicon germanium material, a silicon on insulator (commonly called SOI) depending on the embodiment. In certain embodiments, the semiconductor substrate can have one or more MOS devices formed thereon. The one or more MOS devices can be controlling circuitry for the resistive switching device in a specific embodiment. The resistive switching device includes a first electrode, a second electrode, and a resistive switching material configured in an intersecting region of the first electrode and the second electrode. In a specific embodiment, the resistive switching material can be a silicon material having an intrinsic semiconductor characteristic. The silicon material can be a single crystal silicon, polycrystalline silicon, polycrystalline silicon germanium material, and others, each of which having an intrinsic semiconductor characteristic.

In a specific embodiment, the silicon material is an amorphous silicon material and/or silicon oxide having an intrinsic semiconductor characteristic, or not intentionally doped in a specific embodiment. The first electrode includes a junction material in physical and electrical contact with a first surface region of the resistive switching material. The second electrode includes an active metal material in physical contact with a second surface region opposite to the first surface region of the resistive switching material. The active metal material can be a silver material for amorphous silicon switching material.

Depending on the application, the resistive switching device can include a first wiring structure coupled to the first electrode and a second wiring structure coupled to the second electrode to provide connections to the controlling circuitry on the substrate in a specific embodiment. Again depending on the embodiment, the first wiring structure and the second wiring structure can each include one or more adhesion material or diffusion barrier material to improve adhesion or reduce contamination of the resistive switching device. In a specific embodiment, a tungsten material is provided interposing the second wiring structure and the active metal material for electrical contact as well as adhesion of the second wiring structure to the silver active metal material. In certain embodiments, the first wiring structure and the second wiring structure are arranged perpendicular to each other for a high density vertically integrated device.

Though the present invention has been exemplified in various embodiments, it is to be understood that the examples and embodiment described herein are for illustrative purpose only purposes only and that various modifications or alternatives in light thereof will be suggested to persons skilled in the art and are to be included within the spirit and purview of this application and scope of the appended claims.

What is claimed is:

1. A resistive switching device for a non-volatile memory device, comprising:
    a substrate having a surface region;
    a first dielectric layer overlying the surface region of the substrate;
    a first wiring structure overlying the first dielectric layer;
    a junction layer overlying the first wiring structure;
    a resistive switching layer overlying the junction layer;
    an active metal layer overlying the resistive switching layer;
    an adhesion layer comprising a tungsten material overlying and in contact with the active metal layer;
    a diffusion barrier layer overlying and in contact with the adhesion layer, the diffusion barrier layer not including tungsten;
    a stack of material comprising the junction layer, the resistive switching layer, the active metal layer, and the adhesion layer, wherein the stack of material is characterized by a side wall with a reduced gap region between the diffusion barrier layer and the resistive switching layer; and
    a second wiring structure overlying the stack of material including the diffusion barrier layer.

2. The resistive switching device of claim 1 wherein the substrate comprises one or more transistor devices formed thereon, the one or more transistor devices provides for controlling circuitry for the resistive switching device.

3. The resistive switching device of claim 1 wherein the junction layer is selected from a group consisting of: a silicon-containing material having a p+ impurity characteristic, a single crystal silicon material, a p-doped polycrystalline silicon material, and a p-doped silicon germanium material.

4. The resistive switching device of claim 1 wherein the resistive switching layer is selected from a group consisting of: an amorphous silicon material having an intrinsic semiconductor characteristic, a polycrystalline silicon material having an intrinsic semiconductor characteristic, a polycrystalline silicon germanium material having an intrinsic semiconductor characteristic, and a silicon oxide.

5. The resistive switching device of claim 1 wherein the active metal layer is selected from a group consisting of: silver, gold, platinum, palladium, nickel, zinc, aluminum, copper, and an alloy of two or more of the foregoing members of the group.

6. The resistive switching device of claim 1 wherein the adhesion layer comprises tungsten having a thickness within a range of about 30 Angstroms to about 120 Angstroms.

7. The resistive switching device of claim 1 wherein the active metal layer comprises silver material; and
    wherein the tungsten material is formed directly upon the silver material.

8. The resistive switching device of claim 7 wherein the tungsten material is formed in situ.

9. The resistive switching device of claim 1 wherein the stack of material comprises a cross-sectional shape selected from a group consisting of: approximately circular, approximately square, and approximately polygonal.

10. The resistive switching device of claim 1 wherein the diffusion barrier layer comprises a nitride.

11. The resistive switching device of claim 1 wherein the diffusion barrier layer comprises titanium.

12. The resistive switching device of claim 10 wherein the diffusion barrier layer comprises nitrogen.

13. The resistive switching device of claim 12 wherein the diffusion barrier layer comprises Ti/TiN.

* * * * *